(12) United States Patent
Racine et al.

(10) Patent No.: US 12,405,217 B2
(45) Date of Patent: Sep. 2, 2025

(54) COMPACT DEVICE FOR CHARACTERIZING A PHOTOLUMINESCENT SUBSTANCE

(71) Applicant: COMMISSARIAT A L'ENERGIE ATOMIQUE ET AUX ENERGIES ALTERNATIVES, Paris (FR)

(72) Inventors: Benoit Racine, Grenoble (FR); Pierre Blandin, Grenoble (FR); Etienne Quesnel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 932 days.

(21) Appl. No.: 17/644,113

(22) Filed: Dec. 14, 2021

(65) Prior Publication Data

US 2022/0187206 A1 Jun. 16, 2022

(30) Foreign Application Priority Data

Dec. 16, 2020 (FR) .................................. 20 13407

(51) Int. Cl.
*G01N 21/64* (2006.01)
*H10F 55/255* (2025.01)
(Continued)

(52) U.S. Cl.
CPC ..... *G01N 21/6445* (2013.01); *G01N 21/6428* (2013.01); *H10F 55/255* (2025.01);
(Continued)

(58) Field of Classification Search
CPC ........... G01N 21/6445; G01N 21/6428; G01N 2021/6439; G01N 2021/6471;
(Continued)

(56) References Cited

U.S. PATENT DOCUMENTS 7,652,266 B2 * 1/2010 Squirrell .............. G01N 21/645
250/458.1
7,675,045 B1 * 3/2010 Werner .................. G02B 21/16
250/459.1
(Continued)

FOREIGN PATENT DOCUMENTS

FR          3117595 B1 * 10/2023  ......... G01N 21/6428
WO     WO 2010/055308 A1    5/2010
WO     WO 2010/100408 A1    9/2010

OTHER PUBLICATIONS

French Preliminary Search Report issued Jul. 16, 2021 in French Application 20 13407 filed on Dec. 16, 2020, 11 pages (with English Translation of Categories of Cited Documents & Written Opinion).
(Continued)

*Primary Examiner* — David P Porta
*Assistant Examiner* — Gisselle M Gutierrez
(74) *Attorney, Agent, or Firm* — Oblon, McClelland, Maier & Neustadt, L.L.P.

(57) ABSTRACT

Device (1) for characterizing a substance (2) capable of emitting a photoluminescence radiation (Rp) in a first spectral range, the device (1) comprising:
  an electroluminescent component (3), at least semi-transparent in the first spectral range, and comprising first and second opposite surfaces (30, 31), the electroluminescent component (3) being suitable for emitting an excitation radiation ($Re_1$) outgoing from the first surface (30), emitted in a first spectral range according to a circular polarization state; the excitation radiation ($Re_1$) outgoing from the first surface (30) being able to pass through the electroluminescent component (3), after being reflected, and exit from the second surface (31);
  a polarization filter (4), arranged to filter the excitation radiation ($Re_2$) outgoing from the second surface (31),
(Continued)

and suitable for modifying the circular polarization state so as to obtain an extinguishing of the excitation radiation ($Re_2$) outgoing from the second surface (31) of the electroluminescent component (3);

a detector (5), arranged to detect the photoluminescence radiation (Rp) outgoing from the polarization filter (4).

9 Claims, 3 Drawing Sheets

(51) Int. Cl.
  *H10F 77/30* (2025.01)
  *H10F 77/50* (2025.01)
  *H10K 59/60* (2023.01)
  *H10K 59/80* (2023.01)

(52) U.S. Cl.
  CPC ........... *H10F 77/337* (2025.01); *H10F 77/50* (2025.01); *H10K 59/60* (2023.02); *G01N 2021/6439* (2013.01); *G01N 2021/6471* (2013.01); *G01N 2021/6482* (2013.01); *H10K 59/873* (2023.02)

(58) Field of Classification Search
  CPC ..... G01N 2021/6482; G01N 2021/216; G01N 21/645; G01N 21/6486; H10F 55/255; H10F 77/337; H10F 77/50; H10K 50/84; H10K 59/60; H10K 59/873
  See application file for complete search history.

(56) References Cited

U.S. PATENT DOCUMENTS

| | | | | |
|---|---|---|---|---|
| 8,395,770 B1* | 3/2013 | Hug | ....................... | G01N 21/65 356/417 |
| 8,471,221 B2* | 6/2013 | Hennig | .............. | G01N 21/6486 250/461.1 |
| 8,987,686 B2* | 3/2015 | Rizkallah | ................ | G01N 21/64 250/459.1 |
| 2007/0087445 A1* | 4/2007 | Tearney | .............. | G01N 21/6408 436/172 |
| 2007/0223006 A1* | 9/2007 | Tearney | .............. | G01N 21/6445 356/498 |
| 2008/0246968 A1* | 10/2008 | Kelso | .................. | G01N 21/6428 356/417 |
| 2011/0189787 A1* | 8/2011 | Graves | ................... | G01J 3/4406 250/459.1 |
| 2012/0034701 A1 | 2/2012 | Hofmann et al. | | |
| 2012/0261591 A1* | 10/2012 | Egger | .................. | G01N 21/645 250/206 |
| 2016/0116411 A1* | 4/2016 | Buczkowski | .......... | G01N 21/55 356/402 |
| 2018/0080875 A1* | 3/2018 | Mattioli Della Rocca | .................. | G01N 21/6428 |
| 2021/0033837 A1* | 2/2021 | Dholakia | ............. | G02B 21/367 |
| 2021/0123808 A1* | 4/2021 | Polli | ..................... | G01J 3/2823 |
| 2023/0062339 A1* | 3/2023 | Mage | .................... | G01J 3/4406 |
| 2023/0175963 A1* | 6/2023 | Deissler | ............. | G01N 21/6428 |
| 2024/0069316 A1* | 2/2024 | Doubek | ................. | G02B 21/06 |

OTHER PUBLICATIONS

Kraker et al., "Integrated organic electronic based optochemical sensors using polarization filters", Applied Physics Letters, vol. 92, No. 3, 2008, 3 pages.

Savvate'ev et al., "Integrated organic light-emitting device/fluorescence-based chemical sensors", Applied Physics Letters, vol. 81, No. 24, Dec. 9, 2002, 3 pages.

* cited by examiner

COMPACT DEVICE FOR CHARACTERIZING A PHOTOLUMINESCENT SUBSTANCE

TECHNICAL FIELD

The invention relates to the technical field of the optical characterization of a photoluminescent substance by detection of the photoluminescence radiation emitted by the substance.

The invention is notably applicable in detection and imaging in biology, and more generally in the field of health.

STATE OF THE ART

An assembly for characterizing a substance capable of emitting a photoluminescence radiation in a first spectral range, known from the state of the art, comprises:
- a container, intended to receive the substance, and comprising first and second opposite walls;
- an electroluminescent component, arranged on the first wall to emit an excitation radiation in a second spectral range suitable for exciting the substance so that the substance can emit the photoluminescence radiation;
- a spectral filter (e.g. interferential), arranged on the second wall to block the excitation radiation outgoing from the second wall and allow the photoluminescence radiation to pass;
- a detector, arranged to detect the photoluminescence radiation outgoing from the spectral filter, the detector being able to be an imager.

The photoluminescence radiation is of much lower intensity than the excitation radiation, typically one photon being emitted by the substance for $10^6$ photons emitted by the electroluminescent component. The spectral filter must therefore have a high rejection rate in the second spectral range, with a transmission value of the order of $10^{-6}$. The spectral filter used can be an interferential filter with complex multilayer structure, comprising several tens of monolayers of different optical indices.

Such an assembly of the state of the art is not entirely satisfactory inasmuch as:
- it is not very compact since the electroluminescent component and the detector are situated on either side of the container,
- such an interferential filter is complex and mechanically extremely constrained, which makes it difficult to directly incorporate in the detector (or in the imager) for added compactness.

SUMMARY OF THE INVENTION

The invention aims to wholly or partly remedy the above-mentioned drawbacks. To this end, a subject of the invention is a device for characterizing a substance capable of emitting a photoluminescence radiation in a first spectral range, the device comprising:
- an electroluminescent component, at least semi-transparent in the first spectral range, and comprising first and second opposite surfaces, the first surface being intended to be oriented towards the substance, the electroluminescent component being suitable for emitting an excitation radiation outgoing from the first and second surfaces, the excitation radiation being emitted in a second spectral range according to a circular polarization state, the excitation radiation being suitable for exciting the substance so that the substance can emit the photoluminescence radiation;
- a polarization filter, arranged to filter the excitation radiation outgoing from the second surface of the electroluminescent component, and suitable for modifying the circular polarization state so as to obtain an extinguishing of the excitation radiation outgoing from the second surface of the electroluminescent component;
- a detector, arranged to detect the photoluminescence radiation outgoing from the polarization filter.

Definitions

"Photoluminescence" is understood to mean the phenomenon by which the substance absorbs photons in the second spectral range of the excitation radiation, and re-emits photons in the first spectral range (offset to higher wavelengths). The term "photoluminescence" covers fluorescence and phosphorescence.

"At least semi-transparent" is understood to mean that the electroluminescent component is semi-transparent or transparent in the first spectral range. "Semi-transparent" is understood to mean that the electroluminescent component has an intensity transmission coefficient, averaged over the first spectral range, of between 30% and 70%, preferably of between 40% and 70%, more preferentially of between 50% and 70%. "Transparent" is understood to mean that the electroluminescent component has an intensity transmission coefficient, averaged over the first spectral range, greater than or equal to 70%, preferably greater than or equal to 80%, more preferentially greater than or equal to 90%.

The term "circular polarization state" can also cover a polarization state that is strictly elliptical when the transverse components of the electrical (or magnetic) field are very slightly different in intensity in the propagation of the excitation radiation.

Thus, such a device according to the invention makes it possible to dispense with an interferential filter, that is difficult to incorporate in a detector (or imager), to greatly reduce the intensity of the excitation radiation crossing the detector. To do this, the electroluminescent component is suitable for emitting a circularly polarized excitation radiation, and is associated with a polarization filter modifying the circular polarization state to obtain an extinguishing of the excitation radiation outgoing from the second surface of the electroluminescent component, and intended to be absorbed by the detector. Such a polarization filter can easily be incorporated in the detector and in the electroluminescent component. Consequently, the electroluminescent component and the detector can then be situated on just one side of a container of the substance, in order to gain compactness compared to the state of the art. Such a device according to the invention therefore makes it possible, for example, to characterize the substance by epifluorescence.

The device according to the invention can comprise one or more of the following features.

According to a feature of the invention, the polarization filter comprises:
- a quarter-wave plate, arranged to modify the circular polarization state of the excitation radiation outgoing from the second surface of the electroluminescent component to a linear polarization state having a first polarization direction;
- a linear polarizer, having a polarization axis at right angles to the first polarization direction, and arranged to obtain the extinguishing of the excitation radiation outgoing from the quarter-wave plate.

Thus, one advantage that is obtained is to completely cut off the excitation radiation outgoing from the second surface of the electroluminescent component. On the other hand, the photoluminescence radiation is not totally blocked by such a polarization filter. Indeed, the detector detects a component (on the polarization axis of the linear polarizer) of the photoluminescence radiation outgoing from the polarization filter. The photoluminescence radiation does not generally have a preferred polarization state (i.e. is not polarized), or else the photoluminescence radiation has a polarization state which is distinct from the circular polarization state of the excitation radiation, for example a linear polarization state, such that the detector always detects a component of the photoluminescence radiation on the polarization axis of the linear polarizer. More specifically, when the photoluminescence radiation has a linear polarization state, the quarter-wave plate introduces a phase-shift of 90°, and the photoluminescence radiation leaves the quarter-wave plate with an elliptical polarization state, so that the detector can detect a component of the photoluminescence radiation on the polarization axis of the linear polarizer.

According to a feature of the invention, the substance comprises several types of elements that can emit the photoluminescence radiation at predetermined distinct wavelengths; and the device comprises optical spectral filters, suitable for filtering the photoluminescence radiation at the predetermined distinct wavelengths, and arranged between the polarization filter and the detector, the optical spectral filters being preferably coloured filters arranged in a Bayer matrix.

Thus, one advantage that is obtained by the optical spectral filters is to be able to discriminate different types of elements which re-emit at distinct wavelengths in the first spectral range, for example when the substance comprises fluorescent quantum dots. The different types of elements of the substance are excited in the second spectral range.

This is made possible by virtue of the extinguishing of the excitation radiation outgoing from the second surface of the electroluminescent component by the polarization filter, allowing a reduction of the constraints in terms of optical density for the optical spectral filters. The optical spectral filters used will be able to have an optical density of between 1 and 2, while an optical density greater than 6 would be necessary to block the excitation radiation outgoing from the second surface of the electroluminescent component in the absence of a polarization filter. Now, a filter having an optical density greater than 6 is not at all suitable for filtering (sorting) colours.

According to a feature of the invention, the electroluminescent component is chosen from among:
  an organic electroluminescent component, preferably comprising organic light-emitting diodes;
  an inorganic electroluminescent component, preferably comprising light-emitting diodes of spin-LED type.

According to a feature of the invention, the detector comprises photodiodes.

According to a feature of the invention, the excitation radiation is suitable for exciting the substance comprising elements chosen from among fluorescent quantum dots and organic fluorophores.

Also a subject of the invention is a system for characterizing a substance capable of emitting a photoluminescence radiation in a first spectral range, the system comprising:
  a device according to the invention;
  a separating wall, intended to separate the substance and the device, the separating wall being at least semi-transparent in the first and second spectral ranges;
  the first surface of the electroluminescent component being mounted on the separating wall.

Definition

"At least semi-transparent" is understood to mean that the separating wall is semi-transparent or transparent in the first and second spectral ranges. "Semi-transparent" is understood to mean that the separating wall has an intensity transmission coefficient, averaged over each of the first and second spectral ranges, of between 30% and 70%, preferably of between 40% and 70%, more preferentially of between 50% and 70%. "Transparent" is understood to mean that the separating wall has an intensity transmission coefficient, averaged over each of the first and second spectral ranges, greater than or equal to 70%, preferably greater than or equal to 80%, more preferentially greater than or equal to 90%.

Also a subject of the invention is an assembly for characterizing a substance capable of emitting a photoluminescence radiation in a first spectral range, the assembly comprising:
  a device according to the invention;
  a container, intended to receive the substance, and comprising first and second opposite walls that are at least semi-transparent in the first and second spectral ranges; the first surface of the electroluminescent component being mounted on the first wall;
  an absorber, arranged on the second wall, and suitable for absorbing the excitation radiation outgoing from the first surface of the electroluminescent component and passing through the first and second walls.

Definitions

"At least semi-transparent" is understood to mean that the first and second walls are semi-transparent or transparent in the first and second spectral ranges. "Semi-transparent" is understood to mean that the first and second walls have an intensity transmission coefficient, averaged over each of the first and second spectral ranges, of between 30% and 70%, preferably of between 40% and 70%, more preferentially of between 50% and 70%. "Transparent" is understood to mean that the first and second walls have an intensity transmission coefficient, averaged over each of the first and second spectral ranges, greater than or equal to 70%, preferably greater than or equal to 80%, more preferentially greater than or equal to 90%.

Thus, one advantage provided by the absorber is to prevent a reflection of the excitation radiation outgoing from the first surface of the electroluminescent component and passing through the first and second walls. Such a reflection at normal incidence would be prejudicial because it would reverse the circular polarization state of the excitation radiation (transition from a right circular state to a left circular state, or vice versa), and would render the polarization filter inoperative for a part of the excitation radiation outgoing from the second surface of the electroluminescent component, after having undergone a reflection and after having passed through the electroluminescent component, from the first surface to the second surface.

Also a subject of the invention is an assembly for characterizing a substance capable of emitting a photoluminescence radiation in a first spectral range, the assembly comprising:
  a device according to the invention;
  a container, intended to receive the substance, and comprising first and second opposite walls that are at least semi-transparent in the first and second spectral ranges; the first surface of the electroluminescent component being mounted on the first wall;

an additional polarization filter, arranged to filter the excitation radiation outgoing from the second wall, and suitable for modifying the circular polarization state so as to obtain an extinguishing of the excitation radiation outgoing from the second wall;

an additional detector, arranged to detect the photoluminescence radiation outgoing from the additional polarization filter.

Thus, one advantage obtained is to ensure a dual detection of the photoluminescence radiation on either side of the container.

BRIEF DESCRIPTION OF THE DRAWINGS

Other features and advantages will emerge from the detailed explanation of different embodiments of the invention, the explanation being accompanied by examples and references to the attached drawings.

Figure 1:
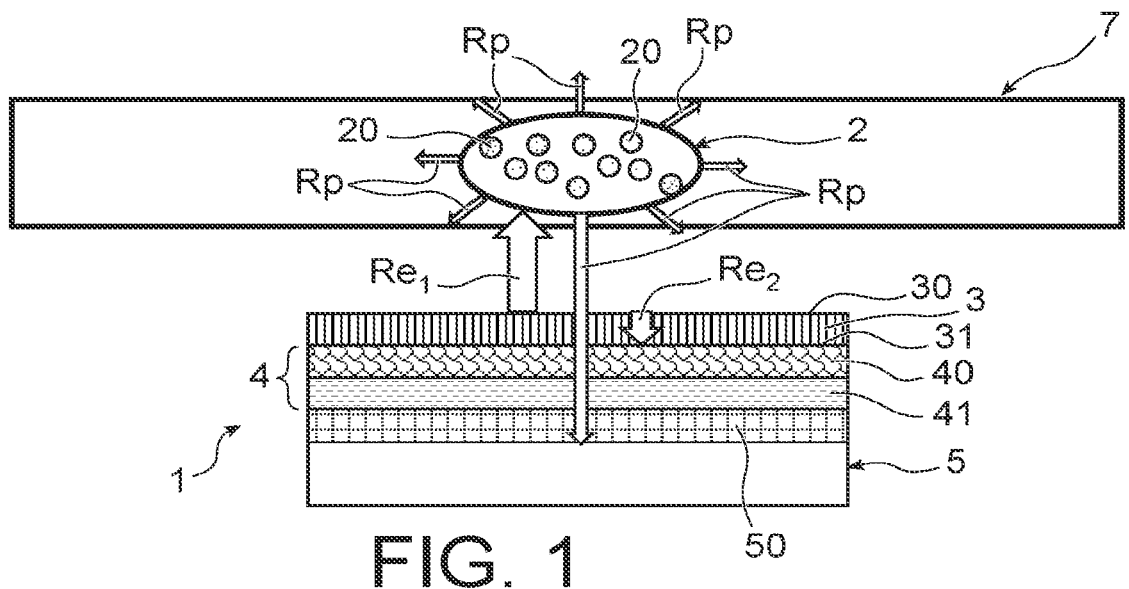
FIG. 1 is a schematic view in cross-section illustrating the operation of a device according to the invention.

It should be noted that the drawings described above are schematic, and are not to scale in the interests of legibility and to simplify the understanding thereof.

DETAILED EXPLANATION OF THE EMBODIMENTS

The elements that are identical or provide the same function will bear the same references for the different embodiments, in the interests of simplification.

One subject of the invention is a device 1 for characterizing a substance 2 capable of emitting a photoluminescence radiation Rp in a first spectral range, the device 1 comprising:

an electroluminescent component 3, at least semi-transparent in the first spectral range, and comprising first and second opposite surfaces 30, 31, the first surface 30 being intended to be oriented towards the substance 2, the electroluminescent component 3 being suitable for emitting an excitation radiation $Re_1$, $Re_2$ outgoing from the first and second surfaces 30, 31, the excitation radiation $Re_1$, $Re_2$ being emitted in a second spectral range according to a circular polarization state, the excitation radiation $Re_1$ being suitable for exciting the substance 2 such that the substance 2 can emit the photoluminescence radiation Rp;

a polarization filter 4, arranged to filter the excitation radiation $Re_2$ outgoing from the second surface 31 of the electroluminescent component 3, and suitable for modifying the circular polarization state so as to obtain an extinguishing of the excitation radiation $Re_2$ outgoing from the second surface 31 of the electroluminescent component 3;

a detector 5, arranged to detect the photoluminescence radiation Rp outgoing from the polarization filter 4.

Figure 2:
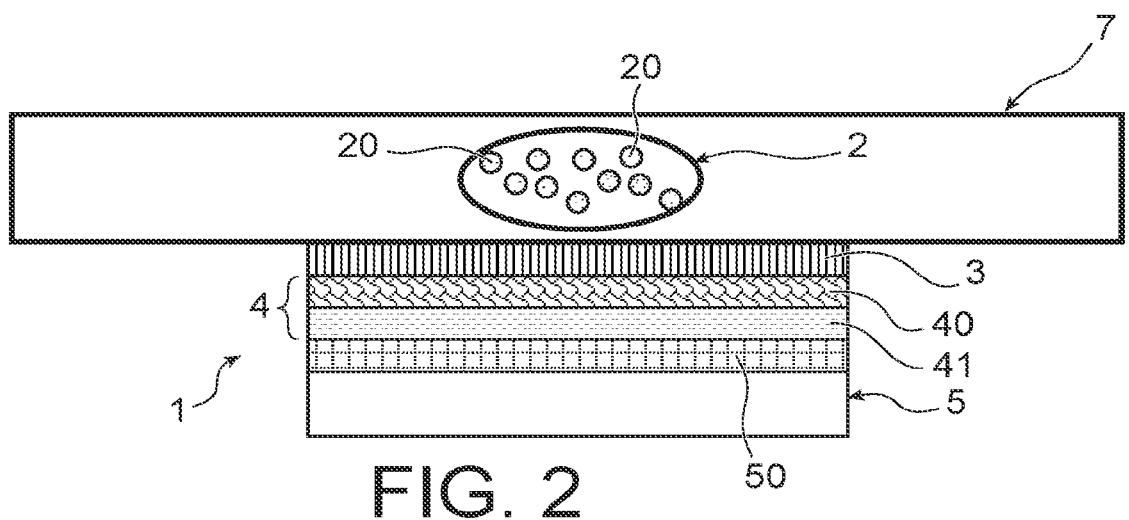
FIG. 2 is a schematic view in cross-section of a device according to the invention, equipping a container provided with the substance to be characterized.

The principle of operation of the device 1 is illustrated in FIG. 1. The device 1 in operating position is illustrated in FIG. 2.

Electroluminescent Component

The electroluminescent component 3 is advantageously chosen from among:

an organic electroluminescent component 3, preferably comprising organic light-emitting diodes;

an inorganic electroluminescent component 3, preferably comprising light-emitting diodes of spin-LED type.

The organic light-emitting diodes of the organic electroluminescent component 3 are advantageously of CP-OLED (Circularly-Polarized Organic Light-Emitting Diodes) type.

The first and second surfaces 30, 31 of the electroluminescent component 3 are advantageously flat surfaces.

Figure 3:
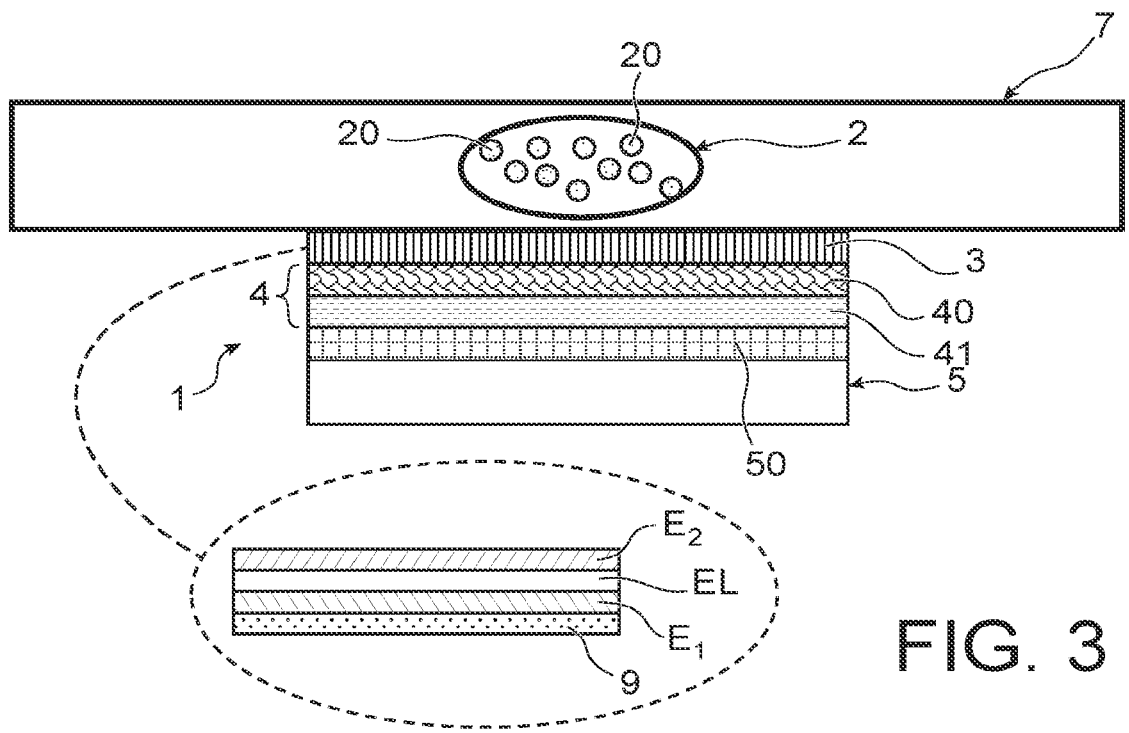
FIG. 3 is a schematic view corresponding to FIG. 2, in which the inset is a larger scale cross-sectional view of the electroluminescent component.

As illustrated in FIG. 3, the electroluminescent component 3 comprises:

first and second electrodes $E_1$, $E_2$, at least semi-transparent in the first and second spectral ranges; the second electrode $E_2$ being intended to be oriented towards the substance 2;

an electroluminescent layer EL, suitable for emitting the circularly-polarized excitation radiation.

The organic electroluminescent component 3 advantageously comprises an encapsulation layer 9, arranged to protect the organic electroluminescent component 3 from air and moisture. The encapsulation layer 9 is preferentially transparent in the first and second spectral ranges so as not to affect the radiation passing through it.

The first electrode $E_1$ can be produced in a metal material, such as Ag, Al, Au, or, more generally, any metal that can be deposited by an evaporation technique. The first electrode $E_1$ can be semi-transparent in the first and second spectral ranges. The second electrode $E_2$ can be produced in indium-tin oxide (ITO). The second electrode $E_2$ can be semi-transparent or transparent in the first and second spectral ranges. The first and second electrodes $E_1$, $E_2$ can be produced in a conductive transparent oxide.

The electroluminescent layer EL can be organic. The organic electroluminescent layer EL is advantageously produced in a chiral organic material. As nonlimiting examples, the chiral organic material can be:

a helicene, such as a platinahelicene, chiral poly(fluorene-alt-benzothiadiazole) (c-PFBT), in which "alt" denotes an alternate copolymer, a complex of lanthanides, an iridium complex (III).

Other examples of organic materials suitable for emitting a circularly polarized electromagnetic radiation are given in the document by J. Han et al., "*Recent Progress on Circularly Polarized Luminescent Materials for Organic Optoelectronic Devices*", Advanced Optical Materials, vol. 6, 17, 2018.

According to an alternative, the electroluminescent layer EL can be inorganic so as to obtain a light-emitting diode of spin-LED type. As nonlimiting examples, the inorganic electroluminescent layer EL can be produced in the form of a quantum well, for example InGaN/GaN or AlGaAs/GaAs. If appropriate, the second electrode $E_2$ is produced in a magnetic material so as to circularly polarize the light emitted by the inorganic electroluminescent layer EL, the magnetic material being able to be, for example, MgO/FeCo.

The electromagnetic radiation emitted by the electroluminescent layer EL can have a dominant wavelength. The spectral range of the electromagnetic radiation emitted by the electroluminescent layer EL (i.e. the second spectral range) is advantageously chosen from among:
- the visible range with wavelengths of between 400 nm and 780 nm,
- the UV-A range with wavelengths of between 315 nm and 400 nm,
- the near-infrared range with wavelengths of between 780 nm and 3 µm.

A spectral range will be chosen as a function of the nature of the substance 2 such that the spectral range lies within the absorption band of the substance 2.

The electroluminescent layer EL is preferentially not in contact with the first and second electrodes $E_1$, $E_2$. The electroluminescent component 3 can for example comprise transport layers (for electrons and holes) and injection layers (for electrons and holes) extending between an electrode $E_1$, $E_2$ and the electroluminescent layer EL (called emissive layer).

Polarization Filter

The polarization filter 4 advantageously comprises:
- a quarter-wave plate 40, arranged to modify the circular polarization state of the excitation radiation $Re_2$ outgoing from the second surface 31 of the electroluminescent component 3 into a linear polarization state having a first polarization direction;
- a linear polarizer 41, having a polarization axis at right angles to the first polarization direction, and arranged to obtain the extinguishing of the excitation radiation outgoing from the quarter-wave plate 40.

In other words, the linear polarizer 41 is crossed in such a way that there is no outgoing excitation wave. The excitation radiation $Re_2$ leaves the quarter-wave plate 40 with a linear polarization state, the quarter-wave plate 40 introducing a phase-shift of 90°. The first polarization direction has an angle of +45° (respectively −45°) with the slow axis of the quarter-wave plate 40 when the excitation radiation $Re_2$ initially has a left circular (respectively right circular) polarization. The polarization axis of the linear polarizer 41 is oriented by forming an angle of −45° (respectively +45° with the slow axis of the quarter-wave plate 40 when the excitation radiation $Re_2$ initially has a left circular (respectively right circular) polarization.

Detector

The detector 5 advantageously comprises photodiodes 50, that can belong to an image sensor.

Figure 4:
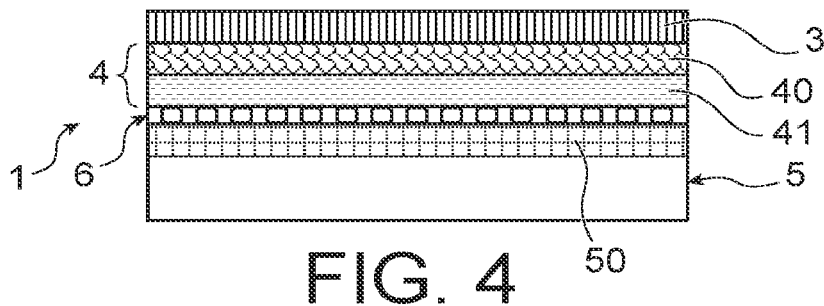
FIG. 4 is a schematic view in cross-section of a device according to the invention, illustrating the presence of optical filters for the photoluminescence radiation.

When the substance 2 comprises several types of elements 20 capable of emitting the photoluminescence radiation Rp at predetermined distinct wavelengths, the device 1 can comprise optical spectral filters 6 (illustrated in FIG. 4), suitable for filtering the photoluminescence radiation Rp at the predetermined distinct wavelengths, and arranged between the polarization filter 4 and the detector 5. The optical spectral filters 6 are preferably coloured filters arranged in a Bayer matrix.

Substance to be Characterized

The excitation radiation $Re_1$ can be suitable for exciting the substance 2 comprising elements 20 chosen from among fluorescent quantum dots and organic fluorophores. The substance 2 can have intrinsic fluorescence, like certain proteins or certain pigments such as chlorophyll. The substance 2 can comprise luminophores/fluorophores incorporated in the substance 2. The substance 2 can be a protein, a cell whose DNA is marked using a luminophore, a cell genetically modified to be fluorescent, etc.

The photoluminescence radiation Rp of the substance 2 is not polarized, or has a polarization state distinct from the circular polarization state of the excitation radiation $Re_1$, $Re_2$ emitted by the electroluminescent component 3.

Characterization System

Figure 5:
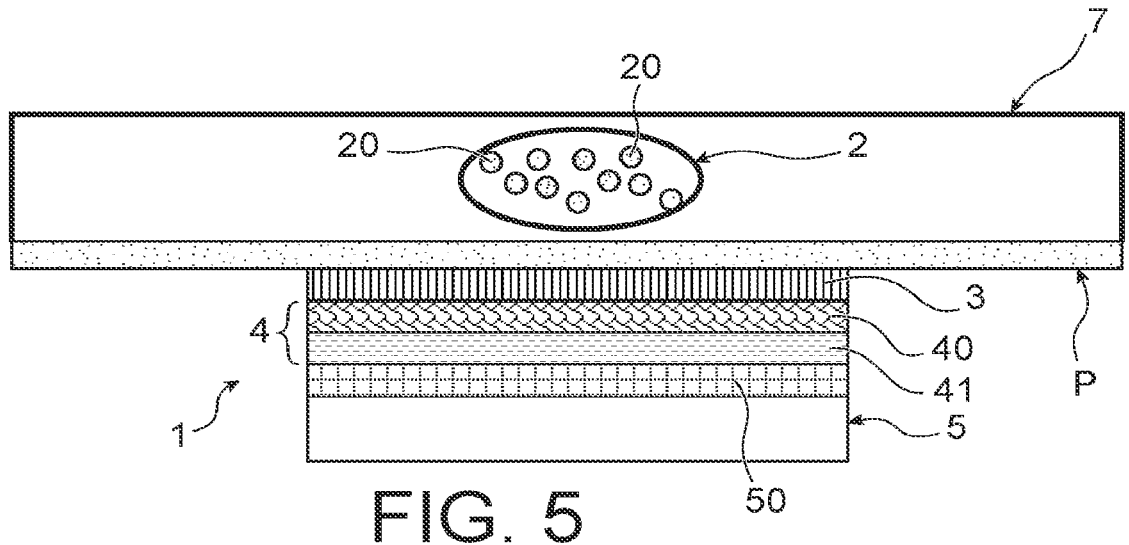
FIG. 5 is a schematic view in cross-section of a system according to the invention, equipping a container provided with the substance to be characterized.

As illustrated in FIG. 5, a subject of the invention is a system for characterizing a substance 2 capable of emitting a photoluminescence radiation Rp in a first spectral range, the system comprising:
- a device 1 according to the invention;
- a separating wall P, intended to separate the substance 2 and the device 1, the separating wall P being at least semi-transparent in the first and second spectral ranges; the first surface 30 of the electroluminescent component 3 being mounted on the separating wall P.

As illustrated in FIG. 5, the separating wall P is arranged to cover a container 7, intended to receive the substance 2.

The electroluminescent component 3 of the device 1, when the latter comprises organic light-emitting diodes, can be formed on the separating wall P by deposition techniques known to the person skilled in the art. The polarization filter 4 of the device 1 can be formed on the electroluminescent component 3 by lamination, then the detector 5 is mounted on the polarization filter 4.

Characterization Assembly: First Embodiment

Figure 6:
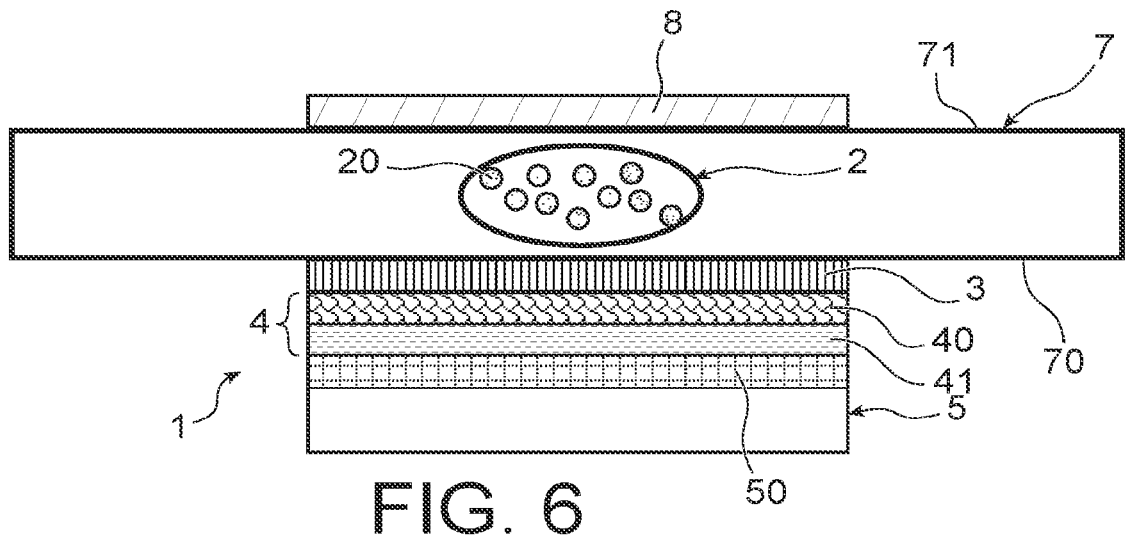
FIG. 6 is a schematic view in cross-section of an assembly according to the invention, in which one wall of the container is provided with an absorber.

As illustrated in FIG. 6, a subject of the invention is an assembly for characterizing a substance 2 capable of emitting a photoluminescence radiation Rp in a first spectral range, the assembly comprising:
- a device 1 according to the invention;
- a container 7, intended to receive the substance 2, and comprising first and second opposite walls 70, 71 that are at least semi-transparent in the first and second spectral ranges; the first surface 30 of the electroluminescent component 3 being mounted on the first wall 70;
- an absorber 8, arranged on the second wall 71, and suitable for absorbing the excitation radiation $Re_1$ outgoing from the first surface 30 of the electroluminescent component 3 and passing through the first and second walls 70, 71.

The absorber 8 can be produced in a material that is opaque in the second spectral range. As nonlimiting examples, the material that is opaque in the second spectral range can be chosen from among:
- a black resin,
- graphite or an amorphous carbon,
- a composite material comprising a metal matrix and a ceramic reinforcement, such as $Al/SiO_2$ and $Ag/WO_3$.

The absorber 8 can also be produced in the form of an anti-reflection layer.

The absorber 8 is advantageously coupled to a reflecting element (not illustrated), arranged to reflect the photoluminescence radiation Rp. Such a reflecting element allows the detector 5 to collect the photoluminescence radiation Rp with a higher intensity. "Reflecting element" is understood to mean that the element has an intensity reflection coefficient, averaged over the first spectral range, greater than or equal to 70%, preferably greater than or equal to 80%, more preferentially greater than or equal to 90%. The reflecting element can be an interferential filter. The reflecting element is transparent in the second spectral range. The reflecting element can be inserted between the second wall 71 and the absorber 8.

The electroluminescent component 3 of the device 1, when the latter comprises organic light-emitting diodes, can be formed on the first wall 70 by deposition techniques known to the person skilled in the art. The polarization filter 4 of the device 1 can be formed on the electroluminescent component 3 by lamination, then the detector 5 is mounted on the polarization filter 4.

Characterization Assembly: Second Embodiment

Figure 7:
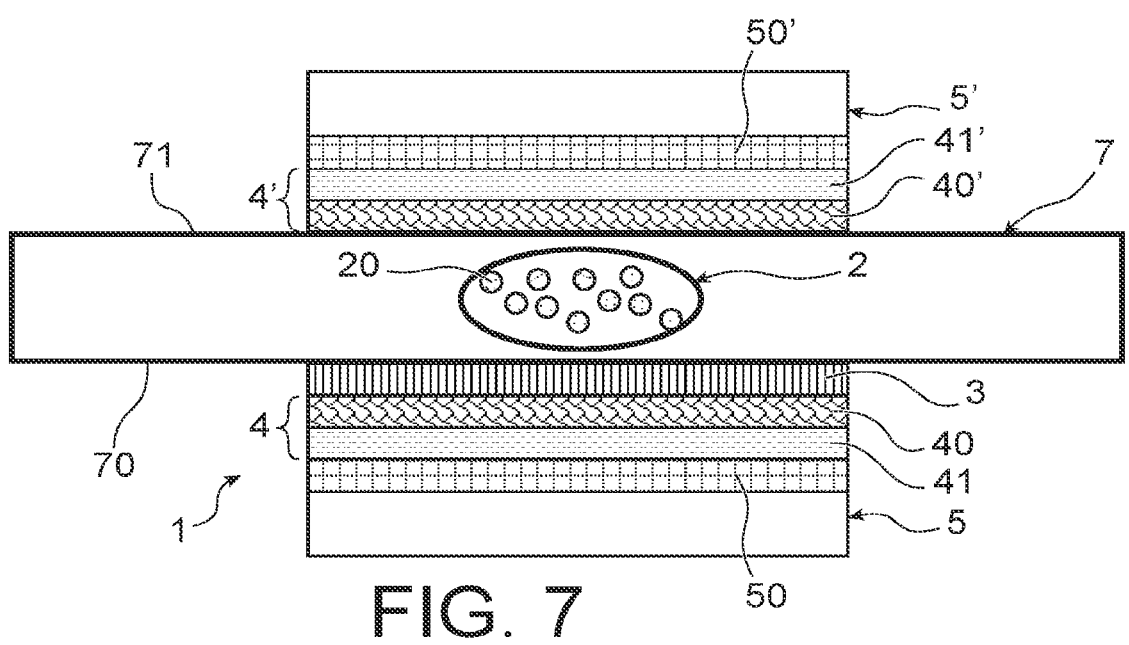
FIG. 7 is a schematic view in cross-section of an assembly according to the invention, in which one wall of the container is provided with an additional polarization filter and with an additional detector.

As illustrated in FIG. 7, a subject of the invention is an assembly for characterizing a substance 2 capable of emitting a photoluminescence radiation Rp in a first spectral range, the assembly comprising:
 a device 1 according to the invention;
 a container 7, intended to receive the substance 2, and comprising first and second opposite walls 70, 71 that are at least semi-transparent in the first and second spectral ranges; the first surface 30 of the electroluminescent component 3 being mounted on the first wall 70;
 an additional polarization filter 4', arranged to filter the excitation radiation outgoing from the second wall 71, and suitable for modifying the circular polarization state so as to obtain an extinguishing of the excitation radiation outgoing from the second wall 71,
 an additional detector 5', arranged to detect the photoluminescence radiation Rp outgoing from the additional polarization filter 4'.

The additional polarization filter 4' advantageously comprises:
 an additional quarter-wave plate 40', arranged to modify the circular polarization state of the excitation radiation outgoing from the second wall 71 into a linear polarization state having a first polarization direction;
 an additional linear polarizer 41', having a polarization axis at right angles to the first polarization direction, and arranged to obtain the extinguishing of the excitation radiation outgoing from the additional quarter-wave plate 40'.

The electroluminescent component 3 of the device 1, when the latter comprises organic light-emitting diodes, can be formed on the first wall 70 by deposition techniques known to the person skilled in the art. The polarization filter 4 of the device 1 can be formed on the electroluminescent component 3 by lamination, then the detector 5 is mounted on the polarization filter 4. The additional polarization filter 4' can be formed on the second wall 71 by lamination, then the additional detector 5' is mounted on the additional polarization filter 4'.

The invention is not limited to the embodiments explained. The person skilled in the art will be able to consider their technically operative combinations, and replace them with equivalents.

The invention claimed is:

1. A device for characterizing a substance capable of emitting a photoluminescence radiation in a first spectral range, the device comprising:
 an electroluminescent component, at least semi-transparent in the first spectral range, and comprising first and second opposite surfaces, the first surface being intended to be oriented towards the substance, the electroluminescent component being designed to emit an excitation radiation outgoing from the first and second surfaces, the excitation radiation being emitted in a second spectral range according to a circular polarization state, the excitation radiation being designed to excite the substance so that the substance can emit the photoluminescence radiation;
 a polarization filter, arranged to filter the excitation radiation outgoing from the second surface of the electroluminescent component, and designed to modify the circular polarization state so as to obtain an extinguishing of the excitation radiation outgoing from the second surface of the electroluminescent component;
 a detector, arranged to detect the photoluminescence radiation outgoing from the polarization filter.

2. The device according to claim 1, wherein the polarization filter comprises:
 a quarter-wave plate, arranged to modify the circular polarization state of the excitation radiation outgoing from the second surface of the electroluminescent component to a linear polarization state having a first polarization direction;
 a linear polarizer, having a polarization axis at right angles to the first polarization direction, and arranged to obtain the extinguishing of the excitation radiation outgoing from the quarter-wave plate.

3. The device according to claim 1, wherein the substance comprises several types of elements capable of emitting the photoluminescence radiation at predetermined distinct wavelengths; and the device comprises optical spectral filters, designed to filter the photoluminescence radiation at the predetermined distinct wavelengths, and arranged between the polarization filter and the detector.

4. The device according to claim 1, wherein the electroluminescent component is chosen from among:
 an organic electroluminescent component, comprising organic light-emitting diodes;
 an inorganic electroluminescent component, comprising light-emitting diodes of spin-LED type.

5. The device according to claim 1, wherein the detector comprises photodiodes.

6. The device according to claim 1, wherein the excitation radiation is designed to excite the substance comprising elements chosen from among fluorescent quantum dots and organic fluorophores.

7. A system for characterizing a substance capable of emitting a photoluminescence radiation in a first spectral range, the system comprising:
 the device according to claim 1;
 a separating wall, intended to separate the substance and the device, the separating wall being at least semi-transparent in the first and second spectral ranges;
 the first surface of the electroluminescent component being mounted on the separating wall.

8. An assembly for characterizing a substance capable of emitting a photoluminescence radiation in a first spectral range, the assembly comprising:
 the device according to claim 1;
 a container, intended to receive the substance, and comprising first and second opposite walls that are at least semi-transparent in the first and second spectral ranges; the first surface of the electroluminescent component being mounted on the first wall;
 an absorber, arranged on the second wall, and designed to absorb the excitation radiation outgoing from the first surface of the electroluminescent component and passing through the first and second walls.

9. An assembly for characterizing a substance capable of emitting a photoluminescence radiation in a first spectral range, the assembly comprising:

the device according to claim 1;

a container, intended to receive the substance, and comprising first and second opposite walls that are at least semi-transparent in the first and second spectral ranges; the first surface of the electroluminescent component being mounted on the first wall;

an additional polarization filter, arranged to filter the excitation radiation outgoing from the second wall, and designed to modify the circular polarization state so as to obtain an extinguishing of the excitation radiation outgoing from the second wall;

an additional detector, arranged to detect the photoluminescence radiation outgoing from the additional polarization filter.

\* \* \* \* \*